United States Patent [19]

Ohuchi et al.

[11] 3,745,424

[45] July 10, 1973

[54] SEMICONDUCTOR PHOTOELECTRIC TRANSDUCER

[75] Inventors: Hirobumi Ohuchi, Hitachi; Yasutoshi Kurihara, Katsuta; Mitsuru Ura; Takuzo Ogawa, both of Hitachi, all of Japan

[73] Assignee: Hitachi, Ltd., Tokyo, Japan

[22] Filed: Sept. 3, 1971

[21] Appl. No.: 177,742

[30] Foreign Application Priority Data

Sept. 11, 1970 Japan ............................... 45/79300

[52] U.S. Cl. ..... 317/235 R, 317/235 N, 317/235 T, 317/235 D, 250/211 J, 317/235 AM

[51] Int. Cl. ......................... H01l 15/00, H01l 19/00

[58] Field of Search ..................... 317/235 N, 235 T, 317/235 D, 235 R, 235 AM; 250/211 J

[56] References Cited

UNITED STATES PATENTS

| | | | |
|---|---|---|---|
| 3,534,231 | 10/1970 | Biard | 317/235 |
| 3,062,092 | 11/1962 | Schmidt | 88/23 |

*Primary Examiner*—Martin H. Edlow

*Attorney*—Craig, Antonelli & Hill

[57] ABSTRACT

A semiconductor photoelectric transducer comprising a unitary structure of an avalanche photo-diode and an amplifying transistor.

8 Claims, 4 Drawing Figures

INVENTORS
HIROBUMI OHUCHI, YASUTOSHI KURIHARA
MITSURU URA, TAKUZO OGAWA
BY Craig, Antonelli & Hill
ATTORNEYS

SEMICONDUCTOR PHOTOELECTRIC TRANSDUCER

BACKGROUND OF THE INVENTION

This invention relates to a semiconductor photoelectric transducer.

DESCRIPTION OF THE PRIOR ART

Avalanche photodiodes are a kind of photodiode in which a light ray impinges on a light receiving surface near a PN junction which is reversely biased to near the critical point at which the diode shows the avalanche phenomenon and the photocurrent generated by the light is amplified by the avalanche phenomenon.

This avalanche photodiode has such advantages that it can operate by a minute quantity of light due to the use of the avalanche phenomenon and that it can operate at an extremely high speed such that the response time is in the order of a nanosecond, but also has such disadvantages that the operation is very unstable. This disadvantage is caused by the fact that the diode is used with a reverse bias near the point at which avalanche phenomenon occurs. Namely, the local avalanche phenomenon may be caused without an irradiation of light ray on the light receiver by a small variation of the bias voltage, and the existence of defects and/or inhomogeneity in the impurity concentration distribution near the reversely biased PN junction.

Thus, it can be considered for eliminating the above drawbacks that the degree of reverse bias is selected to be smaller than the point of maximum avalanche amplification and/or that the light receiving area is arranged to have such a size that uniform avalanche phenomenon occurs over the whole area of the PN junction facing the light receiving surface. However, a decrease in the reverse bias prevents the high amplification of photocurrent obtained by the use of the avalanche phenomenon and a light receiving surface having such an area that the avalanche phenomenon occurs at the whole PN junction surface facing thereto means a decrease of the light receiving area, and thus the photocurrent decreases and hence the output of the avalanche photodiode decreases.

SUMMARY OF THE INVENTION

An object of this invention is to provide a semiconductor photoelectric transducer comprising a unitary structure of an avalanche photodiode and a transistor.

Another object of this invention is to provide a semiconductor photoelectric transducer performing a stable operation.

A further object of this invention is to provide a semiconductor photoelectric transducer of compact size and high output.

DESCRIPTION OF THE PREFERRED EMBODIMENTS

Now, description will be made of preferred embodiments in connection with the accompanying drawing.

Figure 1:
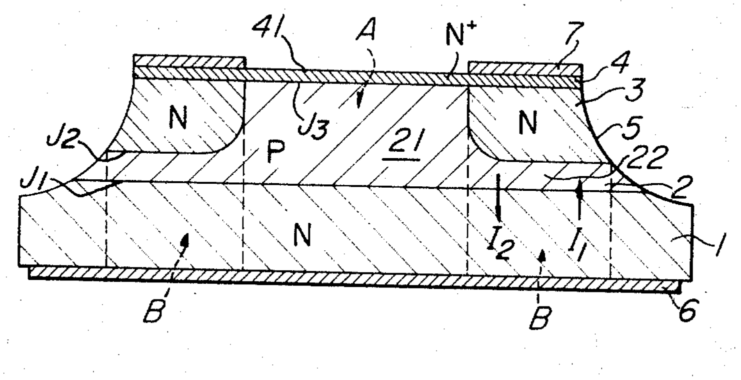
FIG. 1 is a schematic cross section of a semiconductor photoelectric transducer according to the invention.

FIG. 1 shows a semiconductor photoelectric transducer of mesa type structure which comprises a first region 1 of N type conductivity, a second region 2 of P type conductivity formed adjacent to said first region to form a first PN junction $J_1$ therebetween, and a third region 3 of N type conductivity formed around the central portion 21 of said second region 2 to have its exposed surfaces on the opposite side of the second region 2 to the first region and on the side surface, said third region forming a second PN junction $J_2$ with said second region. A fourth region 4 of N type conductivity having a higher impurity concentration than the third region 3 is formed on the opposite surface of the second region 2 to the first region 1, forming a third PN junction $J_3$ with the second region 2. First and second electrodes 6 and 7 are ohmically contacted with low resistance on the exposed surface of the first region 1 and such a surface portion of the fourth region 4 that is registered with the third region 3. A surface portion 41 of the fourth region 4 registered with the central portion 21 of the second region 2 on which said second electrode 7 does not extend forms a light receiving surface of an avalanche photodiode A. The avalanche photodiode A is substantially composed of the central portion 21 of the second region 2 and the central portion 41 of the fourth region 4 formed contiguous to each other with the third PN junction $J_3$ therebetween. An NPN transistor B is formed of the first region 1, peripheral portion 22 of the second region 2 and the third region 3 with the first and second PN junction $J_1$ and $J_2$ disposed therebetween. It is necessary for the transistor region B to normally operate as a transistor so that the thickness of the peripheral portion 22 of the second region 2 must be below about one third of the diffusion length of minority carriers in the second region 2. Generally, the current amplification factor $h_{fe}$ of a transistor can be expressed as $$h_{fe} \approx 2\ (L/W)^2\ ,$$

where, $W$ represents the width or thickness of the base layer and $L$ represents the diffusion length of minority carriers in the base layer. Further, the condition of $h_{fe}$ 20 is needed for effective operation of the transistor. Thus, the relation between the thickness $W$ of a base layer and the diffusion length L of minority carriers in the base layer for effectively operating a transistor becomes $$h_{fe} = 2\ (L/W)^2 > 20$$

$$(L/W)^2 > 10$$

$$W < L/\approx 10 = L/3.1$$

Thus, when the thickness of the peripheral portion 22 of the second region 2 is below one third of the diffusion length of minority carriers in the second region 2, the region B functions as a transistor. Further, for effectively operating the region B as a transistor, the emitter efficiency expressed by $I_1/(I_1 + I_2)$ may be increased, where $I_1$ represents the current due to minority carriers (electrons) emitted from the first region 1 to the second region 2 and $I_2$ represents the current due to majority carriers (positive holes) derived from the second region 2 to the first region 1.

Now, description will be made on the operation of a semiconductor photoelectric transducer of said structure.

Figure 2A:
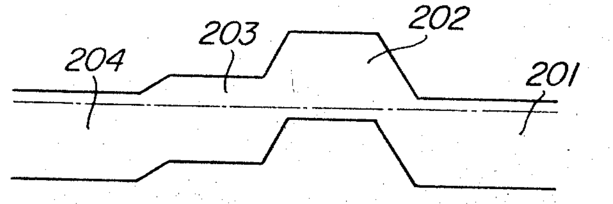
FIGS. 2(a) and 2(b) are energy level diagrams for explaining the operation of the semiconductor photoelectric transducer according to the invention.
Figure 2B:
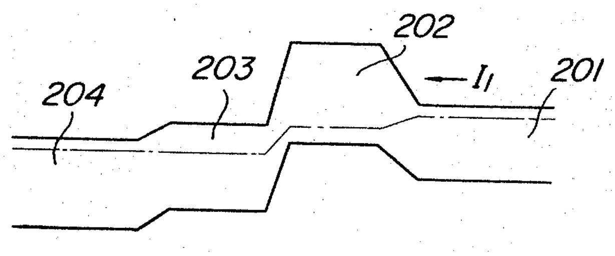

FIG. 2(a) is an energy level diagram of the transducer of FIG. 1, and FIG. 2(b) is an energy level diagram of the transducer of FIG. 1 in the state when a voltage is applied between the first and the second electrode 6 and 7 to make the voltage of the second electrode 7 positive. In the figures, reference numerals 201, 202, 203 and 204 represent the portions corresponding to the first, second, third and fourth region 1, 2, 3 and 4.

Now, consider the case when a voltage is applied between the first and the second electrodes 6 and 7 to make the voltage of the second electrode 7 positive. Under the application of such a voltage, the first PN junction $J_1$ is forwardly biased and the second and the third PN junctions $J_2$ and $J_3$ are reversely biased. Near the reversely biased second and third PN junctions $J_2$ and $J_3$, there are formed depletion layers and the applied voltage is mostly spent in these depletion layers. Since the width of a depletion layer becomes larger as the impurity concentration in the regions sandwitching the PN junction becomes lower, the depletion layer around the third PN junction $J_3$ will have a smaller width than that around the second PN junction $J_2$. Therefore, as the applied voltage is increased, the depletion layer of the smaller width, i.e. the depletion layer of the third PN junction $J_3$, is first broken down. When a light ray impinges on the light receiving surface 41 in a state just below the third PN junction $J_3$ causes breakdown, electrons and positive holes are produced in the depletion layer region of the PN junction $J_3$ and in regions of the second and fourth regions very near to the depletion layer of the PN junction $J_3$, and these carriers enter the depletion layer and cause an avalanche phenomenon, receiving energy from the electric field applied across the depletion layer. By this avalanche phenomenon, a large number of positive holes, i.e. a large current $I_2$ flows from the central portion of the fourth region 4 through the central portion 21 of the second region 2 to the first region 1. This current $I_2$ forms the current due to majority carriers, and the first PN junction $J_1$ may apparently be deemed as not working as an emitter junction of a transistor. The region B, however, works as a transistor since the emitter efficiency becomes large by the fact that the current allowed to flow by the avalanche photodiode A concentrates in the central portion of the first PN junction $J_1$ opposing the third PN junction $J_3$ and the majority carrier current $I_2$ becomes smaller in the peripheral portion of the first PN junction $J_1$ located in the transistor region B and that the junction barrier of the first PN junction $J_1$ is lowered by the current due to the avalanche photodiode B and thus the minority carrier current $I_1$ emitted to the second region becomes larger. By this transistor function, the current due to photodiode avalanche is amplified, and hence a large current can be supplied through the first and the second electrodes.

The inventive semiconductor photoelectric transducer in which an avalanche photodiode and a transistor is unitarily formed in a single semiconductor body has the following advantages compared with the conventional ones:

1. The output current of the avalanche photodiode can be made large enough for utilizing it as a driving signal for other circuits or elements without further amplification;

2. Conventionally the output current of an avalanche photodiode is first amplified in another device and then used, whereas according to this invention an avalanche photodiode and an amplifier circuit are formed unitarily. Thus, a compact and light weight device can be provided;

3. In the transistor used as an amplifier circuit, the emitter and the collector electrodes are formed directly of the electrodes of the avalanche photodiode and no base electrode is needed, therefore, there are needed no separate electrical sources for the transistor;

4. Even if the light receiving area is made smaller and/or the degree of reverse bias of the avalanche photodiode is set weaker more or less than the point just before the breakdown point for stably operating the avalanche photodiode, the output current is amplified by the transistor and hence there are no disadvantages as in the conventional devices.

Next, the manufacture of a semiconductor photoelectric transducer according to the invention will be described.

In FIG. 1, the first region 1 may directly be formed of a silicon wafer cut from an N type single crystal silicon rod grown by the floating zone method or the Czochralski method. The second, the third and the fourth region 2, 3 and 4 may be formed by diffusing impurity exhibiting P type conductivity, then selectively diffusing impurity exhibiting N type conductivity, and then heavily diffusing impurity exhibiting N type conductivity. Here, when the second and the fourth regions are formed by the epitaxial growth method instead of forming all the regions by diffusion, the operation of the avalanche photodiode becomes more stable. That is, in a silicon wafer cut from a single crystal silicon body grown by the floating zone method or the Czochralski method there inevitably exist inhomogeneity in impurity concentration distribution and defects. If such inhomogeneity in impurity concentration distribution or defects lies in the PN junction portion of the avalanche photodiode, the electric field established in the depletion layer becomes non-uniform and hence local avalanche may occur and the current amplification in the whole PN junction surface cannot be made. When the second and the fourth regions are formed by the epitaxial growth method, there are very few inhomogeneities of the impurity concentration distribution and defects, therefore avalanche phenomenon occurs over the whole PN junction surface at the same instant and the operation of the avalanche photodiode becomes very stable.

Figure 3:
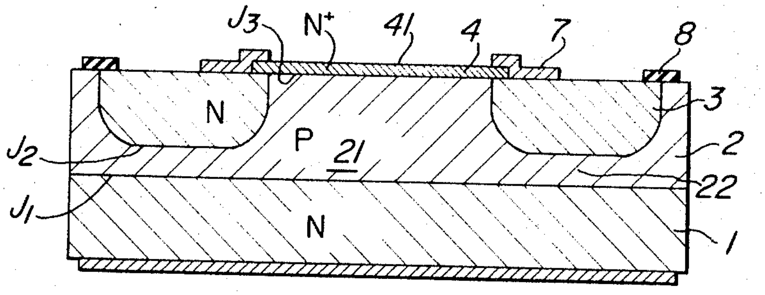
FIG. 3 is a schematic cross section of another embodiment of a semiconductor photelectric transducer according to the invention.

FIG. 3 shows another embodiment of a semiconductor photoelectric transducer according to this invention in which a third region 3 has a planar structure. In FIG. 3, reference numerals indicate similar parts as those of FIG. 1 and reference numeral 8 indicates an oxide film covering the exposed portion of the second PN junction. The transducer of FIG. 3 operates in a similar manner as that of FIG. 1.

In the description referring to FIGS. 1 and 3, the conductivity types of the regions 1, 2, 3 and 4 are designated only for convenience of description and can be reversed, i.e. P to N and N to P, without any substantial loss of the features.

We claim:

1. An avalanche photoelectric transducer comprising:

a semiconductor body having first and second major surfaces on opposite sides thereof;

a first region of a first conductivity type in said semiconductor body extending to said first major surface;

a second region of a second conductivity type contiguous to said first region;

a third region of said first conductivity type formed in the peripheral portion of said second region to surround the central portion of said second region;

a fourth region of said first conductivity type having a higher impurity concentration than said third region disposed on said second and third regions extending to said second major surface;

a first electrode ohmically contacted, with low resistance, to said first major surface;

a second electrode ohmically contacted with low resistance to the surface of said fourth region which is registered with said third region, to form a light receiving plane on the central part of said fourth region, wherein the bottom of said third region is separated from a first pn-junction between said first and second regions; and means for reversely biasing a second pn-junction between said second and fourth regions, and for forwardly biasing said first pn-junction so as to effect a transistor function in the peripheral portion of said semiconductor body.

2. An avalanche photoelectric transducer according to claim 1, wherein said second and fourth regions are substantially homogeneous and have a substantially constant impurity concentration therethroughout.

3. An avalanche photoelectric transducer according to claim 2, wherein said second and fourth regions are substantially homogeneous and have a substantially constant impurity concentration therethroughout.

4. An avalanche photoelectric transducer according to claim 1, in which the thickness of said second region at the location between said first and said third regions is selected at most equal to one third of the diffusion length of the minority carriers in said second region.

5. An avalanche photoelectric transducer comprising:

a semiconductor body having first and second major surfaces on the opposite sides thereof;

a first region of one conductivity type extending to said first major surface;

a second region of a second conductivity type, opposite said one conductivity type, contiguous to said first region;

a third region of said one conductivity type formed in said second region to surround a central part of said second region, the distance from a first pn-junction between said first and second regions to the bottom of said third region being less than one third of diffusion length of minority carriers in said second region;

a fourth region of said one conductivity type formed on said central part of said second region and said third region extending to the second major surface, said fourth region having a higher impurity concentration than said third region;

a ring shaped first electrode ohmically contacted at low resistance to the periphery of said second major surface to surround a light receiving plane, on which light impinges;

a second electrode ohmically contacted to said first major surface; and means for reversely biasing a second pn-junction between said second and fourth regions, and forwardly biasing said first pn-junction to provide a transistor function to said second and third regions.

6. An avalanche photoelectric transducer comprising:

a semiconductor body having first and second major surfaces on the opposite sides thereof;

a first region of one conductivity type extending to said first major surface;

a second region of a conductivity type opposite said one conductivity type contiguous to said first region;

a third region of the one conductivity type formed in said second region, said third region having an annular shape to form a guard-ring, the distance from a first pn-junction between said first and second regions to the bottom of said third region being less than one third of the diffusion length of minority carriers in said second region;

a fourth region of the one conductivity type having a higher impurity concentration than said third region and formed on the surface of said second region surrounded by said third region and on at least a part of the surface of said third region to form a second pn-junction between said second and fourth regions;

a ring-shaped first electrode ohmically contacted with low resistance to both said fourth region and third region to form a light receiving plane surrounded by said first electrode;

a second electrode ohmically contacted with low resistance to said first major surface of said first region; and means for reversely biasing said second pn-junction and for forwardly biasing said first pn-junction, whereby the annular portion of said semiconductor body corresponding to said third region functions as a transistor region.

7. An avalanche photoelectric transducer comprising:

an avalanche photo-diode and a transistor connected with said photo-diode for amplifying the electrical output of said photo-diode representative of light impinging upon said photo-diode, said photo-diode comprising a first portion of a semiconductor body having first and second major surfaces on the opposite sides thereof, said first portion of said semiconductor body including a first region of one conductivity type extending to said first major surface, and a second region of a second conductivity type opposite said one conductivity type contiguous to said first region and forming a first pn-junction at the interface thereof;

said transistor comprising a second portion of said semiconductor body, said second portion including a third region of said one conductivity type extending to said first major surface and being contiguous to said first region, a fourth region of said second conductivity type contiguous to said second region and forming a second pn-junction with said third region at the interface thereof, said second pn-junction being contiguous with said first pn-junction, and a fifth region of said one conductivity type contiguous to said second and fourth regions and having an annular shape, so as to surround a central portion of said second region, said fifth region extending to said second major surface of said semiconductor body at one side thereof and forming a third pn-junction with said fourth region at the other side thereof, said third pn-junction being separated from said second pn-junction by less than one third of the diffusion length of minority carriers in said fourth region, and wherein said transducer further includes a sixth region of said one conductivity type having a higher impurity concentration than said fifth region and formed on the surface of said second region surrounded by said fifth region and on at least a part of the surface of said fifth region to form a fourth pn-junction between said second and sixth regions;

a ring-shaped first electrode ohmically contacting said sixth region over said fifth region, to form a light receiving plane surrounded by said first electrode;

a second electrode ohmically contacting the first major surface of said semiconductor body; and means for applying a reverse bias potential to said fourth pn-junction and a forward bias potential to said first and second pn-junctions, whereby the transistor portion of said semiconductor body will amplify the output of the diode portion thereof.

8. An avalanche photoelectric transducer according to claim 7, wherein said second, fourth and sixth regions are substantially homogeneous and have substantially constant impurity concentration therethroughout.

* * * * *